United States Patent [19]
Bardos et al.

[11] Patent Number: 5,371,360
[45] Date of Patent: Dec. 6, 1994

[54] DUAL FEEDBACK PATH LINEARIZATION OF GALVANOMETER-SCANNED LASER WITH A LASER BEAM SPLITTER HOUSING ASSEMBLY HAVING BEAM SHAPING OPTICS

[75] Inventors: Andrew M. Bardos, Indian Harbour Beach; Jon E. Holmes, West Melbourne; Edward Tegge, Palm Bay, all of Fla.

[73] Assignee: Harris Corporation, Melbourne, Fla.

[21] Appl. No.: 163,247

[22] Filed: Dec. 6, 1993

Related U.S. Application Data

[62] Division of Ser. No. 954,576, Sep. 30, 1992, Pat. No. 5,296,695.

[51] Int. Cl.$^5$ ............................................. H01J 3/14
[52] U.S. Cl. ................................. 250/235; 250/205; 358/475
[58] Field of Search ............ 250/205, 235, 563, 201.1, 250/214 C; 358/475, 479, 480, 481, 494; 372/38, 29, 31

[56] References Cited

U.S. PATENT DOCUMENTS

4,034,230  7/1977  Brill et al. .................... 250/235
4,516,023  5/1985  Morrill et al. ................ 250/235

Primary Examiner—David C. Nelms
Assistant Examiner—Que T. Le
Attorney, Agent, or Firm—Charles E. Wands

[57] ABSTRACT

A laser driver mechanism for image reproduction maintains linear operation over a wide frequency an dynamic range of amplitude-modulated input signals by means of a first feedback loop and a second feedback loop. The second feedback loop contains a first amplifier coupled to receive the input signals and an output coupled to a second amplifier that drives an injection laser diode. A photodetector is coupled downstream of and external to a sealed unit in which the injection laser diode emitter, an associated photodetector of the first feedback loop and beam extraction optics are housed. The photodetector of the second loop has an output coupled to the second amplifier, so that the second feedback loop serves to compensate for non-linearities in the laser driver including those of the first feedback loop. Because the second photodetector is supported externally of the sealed unit, the feedback path from the second photodetector effectively forms an outer loop feedback path relative to the first feedback path, so that the ambient operating conditions of the second photodetector are not affected by the operation of the laser. The sealed unit is mounted in a module that effectively equalizes the cross-sectional spatial distribution of optical energy within the light beam emitted by the injection laser diode and ensures that the spatial cross-section of the image spot seen by the photodetector is effectively constant regardless of laser output beam intensity. For precision scanning of the recording medium, the laser output beam is scanned by a linearly swept galvanometer.

7 Claims, 5 Drawing Sheets

DUAL FEEDBACK PATH LINEARIZATION OF GALVANOMETER-SCANNED LASER WITH A LASER BEAM SPLITTER HOUSING ASSEMBLY HAVING BEAM SHAPING OPTICS

CROSS-REFERENCE TO RELATED APPLICATION

This is a divisional of U.S. patent application Ser. No. 07/954,576, filed Sep. 30, 1992, now U.S. Pat. No. 5,296,695, entitled DUAL FEEDBACK PATH LINEARIZATION OF CURRENT MODULATED LASER, by Andrew M. Bardos et al, and assigned to Harris Corporation, assignee of the present application.

FIELD OF THE INVENTION

The present invention relates in general to image reproduction systems and is particularly directed to a driver mechanism for maintaining linear operation of an electro-optic output device (e.g. laser) through which facsimile imaging reproduction is accomplished for a wide dynamic range of amplitude-modulated input signals.

BACKGROUND OF THE INVENTION

Image reproduction systems, such as high resolution laser facsimile systems, customarily modulate the output of an electro-optic output device, such as a laser, with an image-representative analog input signal, a prescribed characteristic (e.g. amplitude or pulse width) of which varies in accordance with the value of the digital code of a pixel to be reproduced. In order to faithfully replicate each pixel of an original image, it is necessary that the mechanism for controlling the exposure of a pixel-associated region of the hard copy medium accurately (linearly) track the input data over the dynamic range of the input signal.

Modulation of the optical beam may be accomplished separately of the beam generator itself. For example, the output beam of a stable output device, such as a helium-neon laser, may be modulated by controllably adjusting the amount of light passing though a separate optical attenuator, such as an acousto-optic or electro-optic modulator positioned downstream of the laser. Alternatively, the beam may be modulated by controlling the drive current to the laser itself (for example, by controlling the drive current to an injection laser diode).

Where modulation of the laser output beam is accomplished by a device separate from the laser, the drive circuitry is complex, so that the overall size and cost of the system is necessarily high. Where the (drive current to) the laser is (amplitude) modulated, steps must be taken to compensate for the non-linearity of the operation of the laser over the wide dynamic range of the image signal. An example of such a non-linear output vs. drive current characteristic, for the case of an injection laser diode, is illustrated in FIG. 1 as having a relatively gradual slope similar to that of a light emitting diode at the low end 11 of its operational power range and a relatively steep slope similar to that of an injection laser diode at the upper end 13 of its power range (e.g. from a hundred microwatts to several milliwatts).

To compensate for this slope differential and the knee 15 between the two regions 11 and 13, the laser drive circuit customarily contains a classical high gain feedback loop which monitors the optical output and compares it to the input signal. The difference between these two signals is then amplified and fed to the laser. Unfortunately, while such a feedback loop provides some degree of linearity improvement in the laser output characteristic, its principal control mechanism is the use of a drive amplifier having a very large gain. The requirement of a high gain imposes significant bandwidth requirements on the drive amplifier, which will either be impractical to achieve, or will limit the modulation speed of the optical output waveform. Therefore, since there exists a practical limit between gain and bandwidth (i.e. the gain-bandwidth product of an amplifier has a finite limit), the use of a single feedback loop has a limit on the gain and bandwidth that can be achieved. There are also several practical shortcomings of the component hardware used in the feedback loop.

More particularly, in order to provide compact modularity and prevent the integrity of the monitored output beam from being compromised, the laser emitter device, the feedback photodetector and its associated beam extraction optics are customarily housed in a sealed unit in close physical proximity to each other. Because of this compact arrangement, the temperature of the photodetector is increased by heat given off by the laser emitter, which imparts an unwanted operational variation into the feedback loop. Secondly, the beam extraction optics is such that the spatial cross section of the monitored beam seen by the photodetector changes with laser output intensity. Thus, although employing an amplitude modulated injection laser diode may reduce the size and cost of the system as contrasted with pulse width modulation of a separate, hardware intensive helium-neon laser unit), compensation for the inherent non-linear operational characteristic of the laser diode has its own set of problems.

SUMMARY OF THE INVENTION

In accordance with the present invention, the above-described conventionally employed feedback loop, which is intended to provide compensation for the non-linearity in the output characteristic of an amplitude modulated, electro-optic output (laser) device, is enhanced by means of a second (outer) feedback loop which encircles the first (inner) feedback loop. More particularly, the additional feedback loop contains a second amplifier circuit having an input coupled to the input terminal to which the amplitude modulation input signal is applied and an output coupled to the amplifier circuit that drives the injection laser diode. A second photodetector is coupled downstream of and external to the sealed unit in which the injection laser diode emitter, photodetector and beam extraction optics of the first feedback loop are housed. The second photodetector has an output coupled to the input of the second amplifier circuit, so that, in effect, the second feedback loop serves to compensate for non-linearities in the laser driver including those of the first (interior) feedback loop, described above.

In addition, because the second photodetector is supported externally of the sealed package in which the first photodetector is integrally mounted with the injection laser diode, the ambient operating conditions of the second photodetector are not affected by the operation of the laser. Moreover, the sealed package in which the laser and inner loop photodetector are housed is mounted in a module that includes an aperture, which effectively equalizes the cross-sectional spatial distribution of optical energy within the light beam emitted by the injection laser diode and ensures that the spatial cross-section of the image spot seen by the second photodetector is effectively constant regardless of laser output beam intensity. This module is, in turn, mounted within a beam splitter structure that is configured to prevent physical (e.g. manual) interruption of the outer loop feedback path, thereby avoiding an inadvertent loss of signal and a potentially destructive overdriving of the laser.

For precision scanning of successive lines of the reproduction medium, (e.g. photosensitive paper), the laser output beam scanning mechanism preferably employs a linearly swept galvanometer, which requires that the laser beam be blanked during the retrace interval. For this purpose, a blanking signal is coupled to the first amplifier circuit for controllably reducing the drive to the laser to zero and thereby electronically interrupting the generation of the laser output light beam during the retrace interval. In order to prevent the dual feedback loop from overdriving (and destroying) the injection laser diode, the first amplifier circuit includes a drive current control circuit which is operative to limit the level of drive current to the laser to a reduced level during the application of the blanking signal. The drive current control circuit comprises a controllably enabled, unity gain feedback loop coupled between the output and the first input of the second amplifier circuit. When the blanking signal is applied to the first input of the second amplifier, this unity gain feedback loop is operative to set the gain of the second amplifier circuit to a value (unity) that limits the level of drive current to the laser, and thereby prevents the laser from being overdriven during the retrace interval. If no other changes occurred, the second amplifier would be driven into an overload condition by the blanking signal. At the end of the blanking interval, the blanking signal is returned to the normal light output operating level, allowing the second amplifier to return to it's normal operating state. An amplifier in overload does not return to normal levels rapidly or smoothly. If the second amplifier had been allowed to go into overload, then after the blanking interval, the second amplifier,s output would take an unacceptably Lengthy period of time to return to its normal state. Furthermore, the nature of its overload recovery would have overdriven and thereby destroyed the laser. To prevent overload, an automatic gain change circuit is employed in the feedback path of the second amplifier. When the second amplifier is driven past the off level of the laser, a clamp circuit is activated which lowers the gain of the second amplifier. This clamp circuit prevents the second amplifier from entering overload. Therefore, the response of the second amplifier after the blanking amplifier is rapid and smooth.

As an additional safeguard against laser overdrive, the level of the feedback signal through the first feedback loop is continuously compared with a predetermined reference voltage. Should this level exceed the predetermined reference voltage, indicating an overpower condition for the injection laser, the drive to the laser is reduced to a substantially decreased voltage level similar to that of the blanking pulse signal, clamping the drive voltage to a level that maintains the injection laser diode turned off, thereby protecting the laser diode.

The optical bench for mounting the components of the scanning assembly comprises a generally rectangular housing around the interior perimeter of which the scanning components are situated, thereby facilitating access to and servicing of the bench optics and electronics. For precision scanning of successive lines of the reproduction medium, the laser output beam scanning mechanism employs a linearly swept galvanometer to which a beam scanning mirror is affixed. The galvanometer-mounted mirror is oriented so as to reflect the laser output beam to a stationary mirror. The stationary mirror is located above a plane in which the respective optical component support stations are mounted, so that the beam scanned by the galvanometer mirror may impinge upon and scan a vertically spaced apart region of the housing in which a photosensitive medium is supported and advanced by an associated web drive unit. The use of a galvanometer-based scanning mirror assures precision repetitive scanning of successive lines of the image as a photosensitive recording medium is translated in a direction generally perpendicular to the beam scan direction, namely across a recording photosensitive medium off the stationary reflection mirror, since each sweep of the galvanometer traverses the same optical path across the stationary mirror. This offers a significant improvement in optical quality over scanning systems which employ multifaceted mirror blocks mounted to rotating spinner units, as imperfections in alignment of adjacent facets of the mirror block cause successive scan lines of the image to be non-periodic, so that the quality of the resulting image is degraded.

DETAILED DESCRIPTION

As pointed out above, the laser driver linearity improvement mechanism according to the present invention comprises a second, outer feedback loop, which supplements the conventionally employed feedback path via a laser diode ambient outer loop path, so that the response characteristic of the second photodetector is not affected by the operation of the laser, the second feedback path serving to compensate for non-linearities in the laser driver including those of the interior feedback loop.

Figure 1:
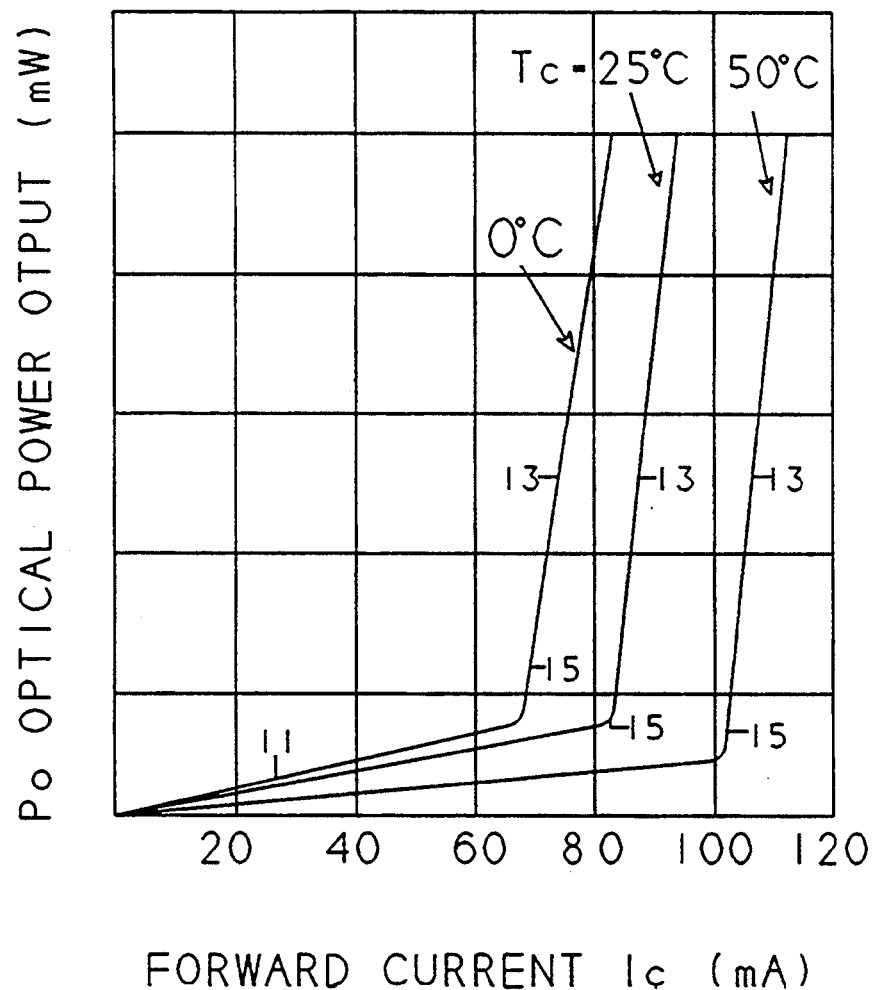
FIG. 1 illustrates the non-linear optical power output vs. current drive current characteristic of an injection laser diode.
Figure 2:
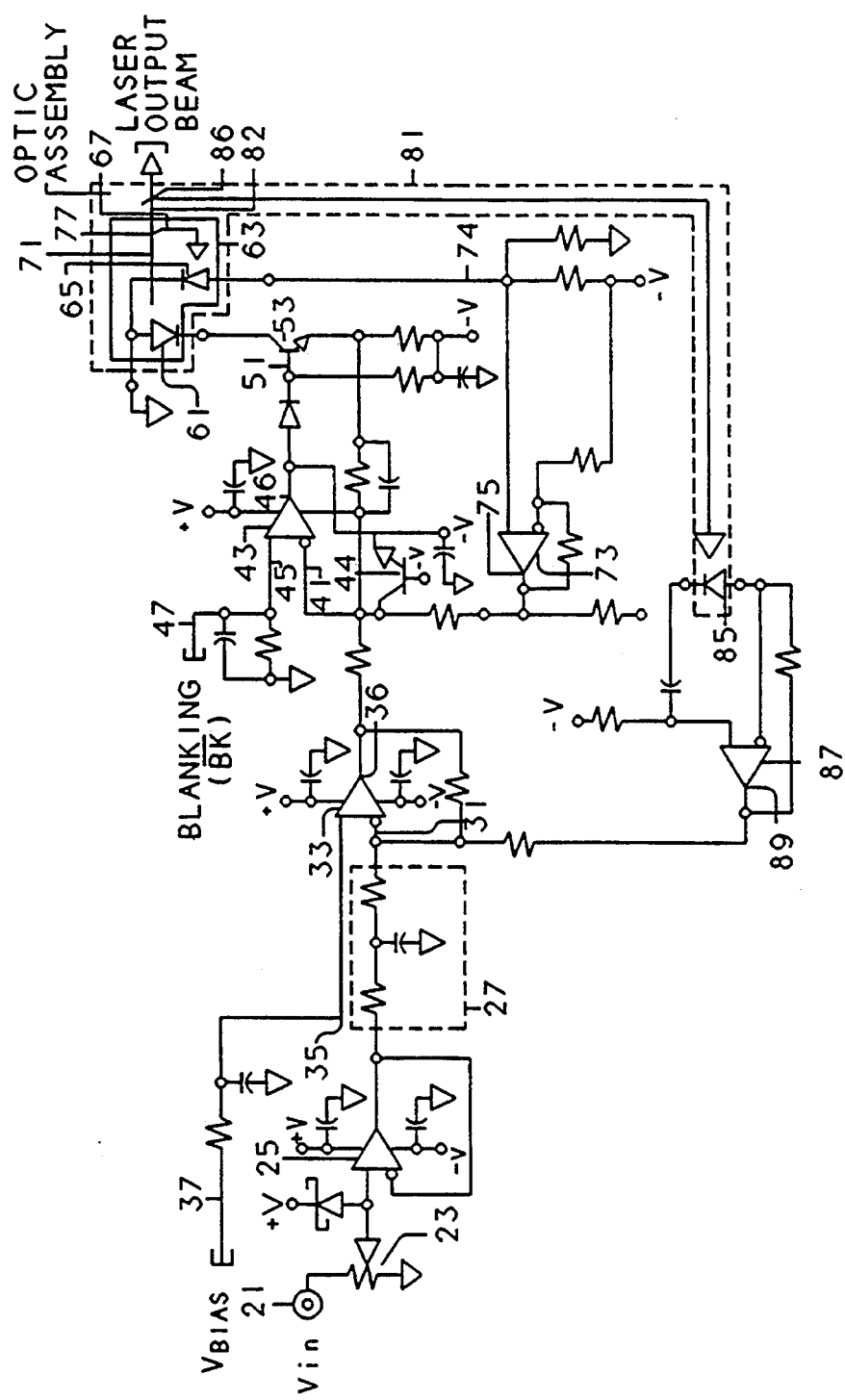
FIGS. 2 and 3 diagrammatically illustrate the circuit configuration of an exemplary, non-limitative embodiment of the laser driver circuitry of the present invention.
Figure 3:
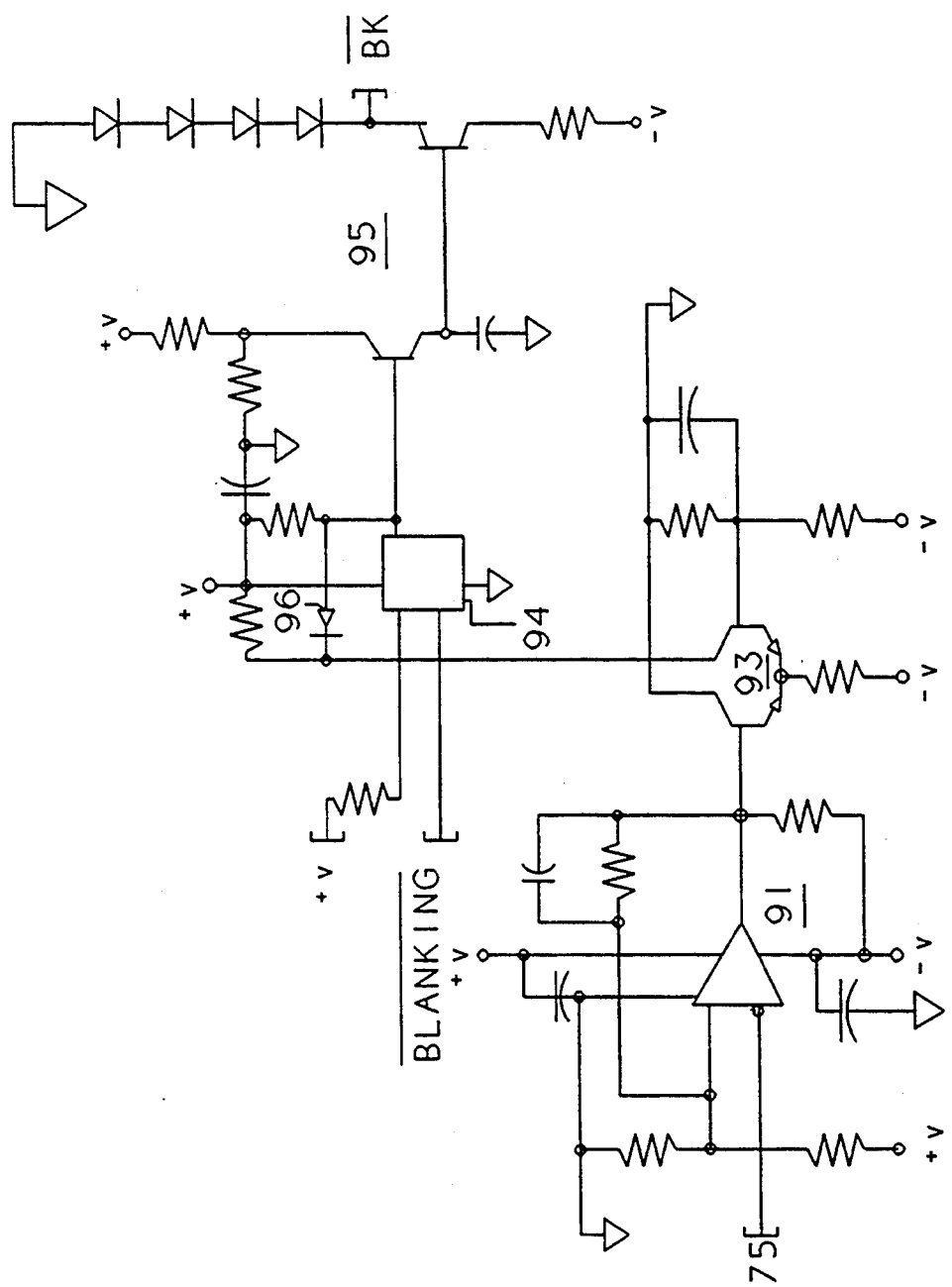

FIGS. 2 and 3 diagrammatically illustrate the circuit configuration of an exemplary, non-limitative embodiment of the present invention. In order to simplify the drawings and their attendant description, FIGS. 2 and 3 do not show regulated power supply circuitry that provides power for and biasing of the respective components of the circuit. It is to be understood that such power supply circuitry has noise rejection and start up protection capability as customarily provided for the purpose.

Referring to FIG. 2, an input terminal 21 is coupled to receive an amplitude-modulated signal representative of the variation in intensity of successively scanned pixels of an input image. The amplitude voltage level of the input signal can represent an analog value of respective digital codes (resolved to some prescribed number of bits per pixel) derived from an opto-electronic input device through which an original still image has been scanned and digital code value outputs of which have been stored in a framestore for subsequent image processing and reproduction.

Input terminal 21 is coupled through a voltage divider 23, which effectively scales the amplitude modulated input signal to a suitable level that falls within a prescribed range of operation of the driver circuitry, to a buffer amplifier 25. The output of buffer amplifier 25 is coupled through a noise-rejection filter 27 to a first input 31 of a first summing amplifier 33. Summing amplifier 33 has a second input 35 coupled to receive a bias voltage 37 though which the operation of the circuit is established.

The output 36 of summing amplifier 33 is coupled to a first input 41 of a second summing amplifier 43. Summing amplifier 43 has a second input 45 coupled to receive a blanking signal applied to a blanking signal terminal 47. As pointed out above, the optical beam emitted by the injection laser is controllably deflected by means of a linearly swept galvanometer, in order to effect precision scanning of successive lines of the reproduction medium (e.g. photosensitive paper). During the retrace interval of the scanned beam it is necessary that the drive input to the laser be effectively turned off so that the output of the laser is 'blanked'. For this purpose, a blanking signal (BK BAR) is applied via terminal 47 to summing amplifier 43 for controllably reducing the drive to the laser and thereby electronically interrupting its output light beam. The blanking signal itself is generated by a blanking pulse generator shown in FIG. 3, to be described below.

Because the blanking signal causes the laser output beam to be turned off, any feedback path monitoring the output level of the laser will operate so as to (destructively) overdrive the input to the laser. To prevent the feedback path from overdriving the laser during a turn off condition, such as the blanking interval, the output 46 of summing amplifier 43 is coupled via the collector-emitter path of a unity gain bipolar NPN transistor 44 to the first input 41 of summing amplifier 43. During a normal imaging signal line scan, transistor 44 is non-conductive, so that the output of summing amplifier 43 follows the input video signal. However, in the presence of a substantially reduced voltage, such as blanking pulse BK BAR, at the second input 45 of summing amplifier 43, the considerably reduced voltage level at the output of amplifier 43 causes the base-emitter junction of NPN transistor 44 to be forward biased, so that the collector-emitter path of transistor 44 couples the output 46 of summing amplifier 43 to its first input 41. This effectively clamps the output voltage level of summing amplifier 43 at a prescribed voltage level (e.g. on the order of −6V in the illustrated embodiment) that maintains the laser turned off, but is not of such a reduced magnitude as to allow amplifier 43 to enter overload. As a consequence, at the termination of the blanking interval defined by the width of blanking pulse BK BAR, the output 46 of summing amplifier 43 is at a voltage level that can rapidly transition to whatever voltage is defined by the input signal at terminal 41.

The output 46 of summing amplifier 43 is applied to the base 51 of an output driver bipolar transistor 53. The collector-emitter path of output driver transistor 53 is coupled in circuit with an electro-optic output device (e.g. an injection laser diode) 61. Injection laser diode 61 may be contained in a unitary assembly (Part No. 1-9280-TSA, manufactured D.O. Industries, Rochester N.Y.), within an integrated, sealed package 63 containing a photodiode 65, collimating optics and an associated optical coupler 67, which is coupled in the optical output path 71 of injection laser diode 61. The current output of photodiode 65 is coupled in a first feedback path 74 to a current-to-voltage converting amplifier 73, the output 75 of which is summed with the output of summing amplifier 43 at summing amplifier input node 41.

One the one hand, the sealed, integrated package 63, in which both laser diode 61 and photodiode 65 are housed, prevents the first feedback path 74 from being physically interrupted (for example by a servicing technician or operator accidentally inserting an object in the path of the output beam) and thereby prevents a potentially destructive overdriving of laser diode 61. On the other hand, because of this compact and sealed arrangement, the temperature of photodiode 65 is affected by heat given off by laser 61, which degrades the response characteristic of the photodiode and thereby imparts an unwanted operational non-linearity into the first feedback loop 74. In addition, the beam extraction optics 77 of the unit 63 are such that the spatial cross section of the monitored beam seen by photodiode detector 65 changes with the laser output intensity, thereby further contributing to the non-linearity of the circuit's operation. Furthermore, this single loop must have very high bandwidth devices to achieve high linearity.

In accordance with the present invention, a second, outer opto-electronic feedback loop 81, which serves to compensate for non-linearities in the laser driver including those of the first feedback loop 74, is coupled to monitor the output beam 82 generated by injection laser diode 61 and to supply a supplementing control input to summing amplifier 43. For this purpose, feedback loop 81 includes a second photodiode detector 85 coupled downstream of the sealed unit 63 in which the laser diode emitter 61, photodiode 65 and beam extraction optics 77 of the first feedback loop 74 are housed. The optical input to photodiode 85 is provided by way of a beam-splitting mirror 86 which is disposed in the path 71 of laser output beam 82. The opto-electronically generated current output of photodiode 85 is coupled to a current-to-voltage converting amplifier 87. The output 89 of current-to-voltage converting amplifier 87 is summed with the amplitude-modulated input signal at the first input node 41 of summing amplifier 43.

Because the second photodiode detector 85 is located externally of the sealed package 63 in which first photodiode 65 is integrally mounted with injection laser diode 61, the second feedback path 81 effectively forms an outer loop feedback path relative to the first (inner loop) feedback path 74, so that the ambient operating conditions of photodiode 85 are not degraded by the operation (thermal heating effects) of injection laser diode 61. Thus, the second feedback path 81 provides a more robust control over the linearity of the operation of the laser driver.

In order to maintain the drive input to the injection laser diode within proper limits, its optical output is monitored via the first feedback loop 74 by comparing the output 75 of current-to-voltage converting amplifier 73 with if a predetermined reference voltage. For this purpose, as shown in FIG. 3, the output 75 of current-to-voltage converter 73 is coupled to a threshold comparator 91, the voltage level output of which changes state from a first logic level to a second logic level if the compared input exceeds the reference voltage. The output of threshold comparator 91 is coupled through a level shift circuit 93 to driver amplifier 95, through which the blanking signal pulse BK BAR produced by blanking signal pulse generator 94 is applied to the second input 45 of summing amplifier 43. Should the monitored voltage input to comparator 91 exceed the threshold reference, indicating an overpower condition for injection laser diode 61, a substantially decreased voltage level (similar to that of the blanking pulse signal output of pulse generator 94) is supplied through diode 96 to driver amplifier 95. Since the output of driver amplifier 95 is coupled to the second input 45 of summing amplifier 43, the output of summing amplifier 43 is driven to a level that turns of laser diode 65. Again, the collector-emitter path of transistor 44 couples the output 46 of summing amplifier 43 to its first input 41, thereby clamping the output voltage level of summing amplifier 43 to a voltage level (e.g. on the order of −6V) that maintains the laser turned off, but is not of such a reduced magnitude as to require a substantially period of time for turn on recovery.

Figure 4:
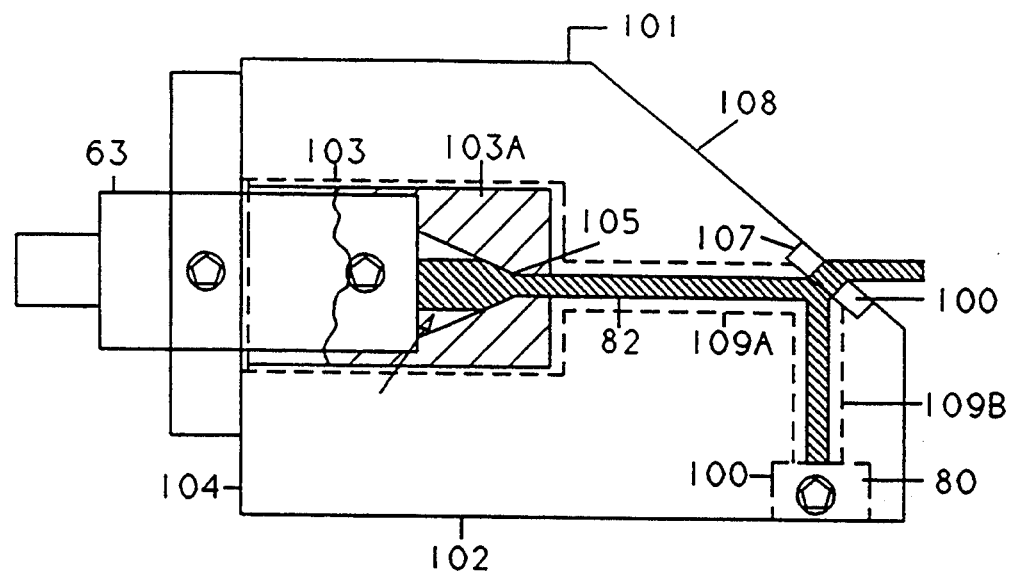
FIG. 4 diagrammatically illustrates a side view of the hardware configuration of a laser/beam splitter housing assembly.
Figure 5:
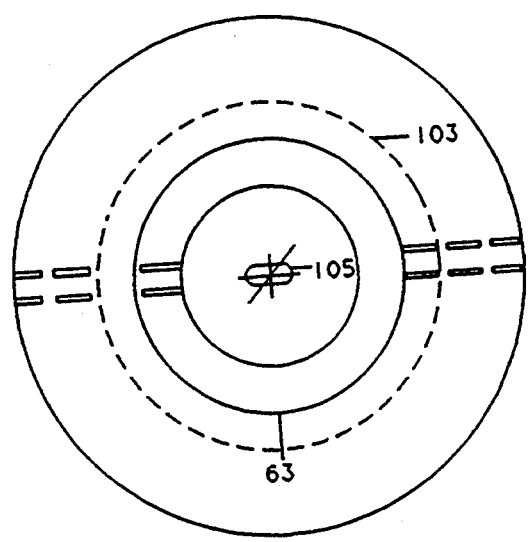
FIG. 5 illustrates an end or optical beam exit view of the laser beam shaping optics of the housing assembly of FIG. 4.

FIG. 4 diagrammatically illustrates a side view of the hardware configuration of a laser/beam splitter housing assembly 101, while FIG. 5 illustrates an end or optical beam exit view of the laser beam shaping optics through which the generally elliptical cross-sectional spatial distribution of optical energy within the light beam emitted by the injection laser diode is effectively equalized and causes the spatial cross-section of the image spot seen by the second, downstream photodetector to be effectively constant regardless of laser output beam intensity.

Figure 6:
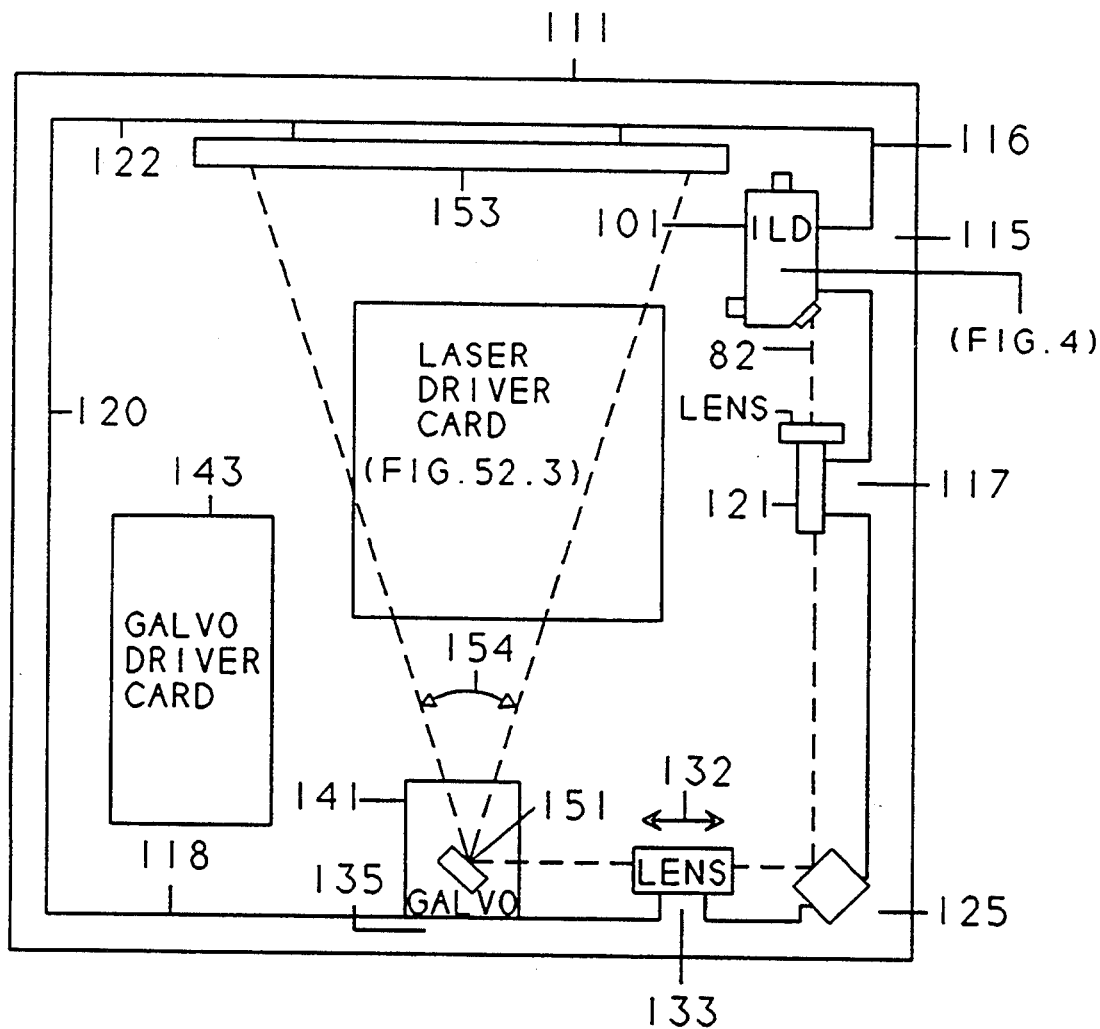
FIG. 6 is a diagrammatic plan view of the optical bench set-up for mounting the components of a laser scanning assembly in accordance with the present invention.

More particularly, as shown in FIG. 4, housing assembly 101 has a generally block configuration having a generally flat or planar first surface 102 that may be mounted to an optical bench wall, as will be described below with reference to FIG. 6. A generally cylindrical cavity or bore 103 extends into the block from a first end surface 104. Bore 103 is sized to receive and retain the sealed package 63 in which the laser diode and inner loop photodetector are housed. It also contains a beam shaping insert 103A having a generally rectangular shaped aperture 105, shown in greater detail FIG. 5, for shaping the beam 82 exiting package 63, and a partially reflective, partially transmissive, beam splitting mirror element 106, which is mounted is in a recess 107 formed in inclined surface 108 of block 101. An optical tunnel or bore 109A through which the shaped laser output beam 82 passes extends through block 101 from cavity 103 to beam splitter 106, while an optical tunnel or bore 109B extends from beam splitter 106 (orthogonally with respect to tunnel 109A) to a recess 100, in which photodiode 85 is retained, so that photodiode 85 will receive a partially reflected portion (e.g. on the order of 20%) of the laser output beam. The bore/tunnel beam travel path configuration of the laser housing assembly effectively prevents physical (e.g. manual) interruption of the outer loop feedback path to photodiode 85, thereby avoiding an inadvertent loss of signal and potentially destructive overdriving of the laser.

For precision scanning of successive lines of the reproduction medium, the laser output beam scanning mechanism preferably employs a linearly swept galvanometer, which requires that the laser beam be blanked during the retrace interval. A plan view of the optical bench set-up for mounting the components of the scanning assembly is diagrammatically illustrated in FIG. 6 as comprising a generally rectangular frame or housing 111, preferably comprised of cast aluminum, around the interior perimeter of which the scanning components are situated, so as to facilitate access to and servicing of the bench optics and electronics.

For this purpose, housing casting 111 comprises a first support static, n or ledge 115, integrally cast with wall 116, upon which beam splitter structure 105 is mounted. As described above, and as shown in FIGS. 4 and 5, laser housing assembly 111 contains sealed package 63, in which injection laser diode 61 and photodetector 65 and collimating optics are housed, as well as beam shaping aperture 105, so that the cross-section of the beam 82 exiting laser housing assembly 101 is essentially rectangular. Mounted optically downstream of laser housing assembly 101, at a second support station or ledge 117 along wall 116, is a first, primary focusing lens 121. The printed circuit board containing the laser driver control circuitry of FIGS. 2 and 3, described above, may be mounted at a generally centrally located station 110, facilitating distribution of signaling and power supply links to respective components of the system within housing 111.

The focused beam output from lens 121 is directed to a mirror block 123 supported at a third support station 125 at the corner or intersection 119 of wall 116 with wall 118 of housing 111. The focused beam is then directed to a second, adjustable focusing lens 131 mounted at a fourth support station 133 along housing wall 118. Lens 131 is mounted so as to translatable in the direction of the beam travel path, as shown by arrow 132, so as to allow for vernier control over the size of the beam spot falling upon the photosensitive medium. Mounted at a fifth support station 135 on wall 118 downstream of lens 131 is a controllably driven (linearly swept) galvanometer 141, the drive circuit 143 of which is mounted at a support station 145 adjacent wall 120, which intersects wall 118. Affixed to galvanometer 141 is a beam scanning mirror 151. Mirror 151 is oriented so as to reflect the beam focused by lens 131 to a stationary mirror 153 mounted an opposite wall 122. Mirror 153 is located above the plane in which the respective optical component support stations along walls 116, 118, 120 are mounted, so that the beam scanned by galvanometer mirror 153 may impinge upon and scan a vertically spaced apart region of the housing in which the photosensitive medium (paper) is supported and advanced by an associated web drive unit (not shown).

As described previously, the use of a galvanometer-based scanning mirror 151 assures precision repetitive scanning of successive lines of the image as a photosensitive recording medium (not shown) is translated in a direction generally perpendicular to the beam scan direction (across the recording photosensitive medium) off stationary reflection mirror 153, since each sweep of the galvanometer traverses the same optical path (shown by sweep angle 154) across stationary mirror 153. (In the diagrammatic illustration of FIG. 6, the photosensitive medium is translated in a direction normal to or into the plane of the drawing.) This offers a significant improvement in optical quality over scanning systems which employ multifaceted mirror blocks mounted to rotating spinner units, as imperfections in alignment of adjacent facets of the mirror block cause successive scan lines of the image to be non periodic, so that the quality of the resulting image is degraded. As will be appreciated from the foregoing description, the shortcomings of a conventionally employed single feedback loop laser driver are obviated in accordance with the present invention by means of a second, outer feedback loop which electronically surrounds the first feedback loop, so as to compensate for nonlinearities in the laser driver. Because the second photodetector is supported externally of the sealed package in which first photodetector is integrally mounted with the injection laser diode, the ambient operating conditions of the second photodetector are not affected by the operation of the laser. Also, the sealed package is mounted in a module which effectively equalizes the cross-sectional spatial distribution of optical energy within the light beam emitted by the injection laser diode and ensures that the spatial cross-section of the image spot seen by the photodetector is effectively constant regardless of laser output beam intensity. Since the module is mounted within a beam splitter structure that is configured to prevent physical handling by service personnel or an operator that would allow interruption of the outer loop feedback path, it is not possible to inadvertently interrupt the beam and cause a loss of signal that could cause potentially destructive overdrive levels to the laser.

Moreover, because precision scanning of successive lines of the reproduction medium is effected by means of a linearly swept galvanometer (requiring that the laser beam be blanked during the mirror retrace interval), so that a blanking signal must be employed to controllably reduce the drive to the laser, a unity gain feedback loop limits the level of drive current to the laser to a reduced level during the blanking interval. As an additional safeguard against laser overdrive, the level of the feedback signal through the first feedback loop is continuously compared with a predetermined reference voltage. Should this level exceed the predetermined reference voltage, indicating an overpower condition for the injection laser, the drive to the laser is reduced to a substantially decreased voltage level similar to that of the blanking signal, clamping the drive voltage to a level that maintains the injection laser diode turned off, thereby protecting the laser diode. Also, since the optical bench for mounting the components of the scanning assembly comprises a generally rectangular housing around the interior perimeter of which the scanning components are situated, access to and servicing of the bench optics and electronics is facilitated.

While we have shown and described an embodiment in accordance with the present invention, it is to be understood that the same is not limited thereto but is susceptible to numerous changes and modifications as known to a person skilled in the art, and wetherefore do not wish to be limited to the details shown and described herein but intend to cover all such chances and modifications as are obvious to one of ordinary skill in the art.

What is claimed:

1. An arrangement for scanning a recording material with an optical beam comprising a housing, said housing having a plurality of wall portions around the interior perimeter of which a plurality of optical scanning components are situated, said plurality of optical scanning components including a beam splitter unit mounted at a first interior wall portion of said housing, said beam splitter unit containing a sealed package enclosing a laser and a first photodetector, and further containing a beam shaping aperture, a focusing lens mounted optically downstream of said laser beam splitter structure at a second interior wall portion of said housing wall for controlling the size of the beam spot falling upon the recording medium, a galvanometer mirror scanner mounted at a third interior wall portion of said housing, and a stationary mirror mounted at a fourth interior wall portion of said housing, said stationary mirror being located so that the beam scanned by galvanometer mirror may impinge upon and scan a region of the housing in which the recording medium is supported and advanced by an associated drive unit.

2. An arrangement according to claim 1, wherein said focusing lens comprises a first, principal focusing lens mounted at a fifth interior wall portion of said housing and a second, adjustable focusing lens mounted at a sixth interior wall portion of said housing, said second focusing lens be mounted so as to be translatable in the direction of the beam travel path, so as to allow for vernier control over the size of the beam spot falling upon said recording medium.

3. An arrangement according to claim 1, further including a laser drive unit for controlling the operation of said laser, said laser drive unit being operative to modulate the amplitude of said laser beam in accordance with an amplitude modulation control signal, and wherein said laser has a light output characteristic that is nonlinear with respect to an input signal applied thereto, said laser drive unit including a first amplifier circuit having an input to which a signal representative of said input signal for controlling the operation of said laser is coupled and an output, and wherein said first photodetector which is coupled to receive light produced by said laser and has an output coupled in a first feedback loop to said first amplifier circuit, so as to reduce the non-linear light output characteristic of said laser, and wherein said laser drive unit comprises a second feedback loop for further reducing the non-linear light output characteristic of said laser, said second feedback loop containing a second amplifier circuit having an input coupled to receive said amplitude modulation signal, and an output coupled to said first amplifier circuit, and a second photodetector which is coupled to a portion of the laser beam emitted by said laser and having an output coupled to said second amplifier circuit.

4. An arrangement according to claim 3, wherein a blanking signal is coupled to said first amplifier circuit for controllably interrupting the production of light by said laser, and wherein said first amplifier circuit includes a drive current control circuit for adjusting the level of drive current to said laser to a prescribed level in response to the application of said blanking signal to said first amplifier circuit.

5. An arrangement according to claim 3, wherein said second photodetector is supported externally of said sealed package in which said first photodetector device is integrally mounted with said laser, such that the feedback path from said second opto-electronic detector device which is coupled to said second amplifier circuit effectively forms an outer loop feedback path relative to said first feedback path.

6. An arrangement according to claim 3, further including a housing assembly in which said laser and said second photodetector device are mounted and having an internal light coupling path through light produced by said laser is coupled to said second photodetector, so that light produced by said laser is effectively prevented from being physically interrupted, thereby protecting said laser from an overdrive condition.

7. An arrangement according to claim 3, wherein said first amplifier circuit further includes a bias voltage input to which a regulated bias voltage is applied to setting the operation of said laser.

* * * * *